US007862899B2

(12) United States Patent
Schettler et al.

(10) Patent No.: US 7,862,899 B2
(45) Date of Patent: Jan. 4, 2011

(54) MULTILAYER STRUCTURE FOR POLYMERS

(75) Inventors: Thomas Schettler, Rehau (DE); Edgar Quandt, Hof (DE)

(73) Assignee: Rehau AG & Co., Rehau (DE)

( * ) Notice: Subject to any disclaimer, the term of this patent is extended or adjusted under 35 U.S.C. 154(b) by 986 days.

(21) Appl. No.: 11/631,330

(22) PCT Filed: Jun. 16, 2005

(86) PCT No.: PCT/EP2005/006440

§ 371 (c)(1),
(2), (4) Date: Jan. 3, 2007

(87) PCT Pub. No.: WO2006/002768

PCT Pub. Date: Jan. 12, 2006

(65) Prior Publication Data

US 2007/0202344 A1    Aug. 30, 2007

(30) Foreign Application Priority Data

Jul. 2, 2004    (DE) .................. 10 2004 032 013

(51) Int. Cl.
*B32B 9/00*    (2006.01)

(52) U.S. Cl. .................. 428/448; 428/446; 428/689; 428/697; 428/701; 428/702

(58) Field of Classification Search ............... 428/428, 428/432, 446, 447, 448, 689, 697, 701, 702
See application file for complete search history.

(56) References Cited

U.S. PATENT DOCUMENTS 5,846,649 A  *  12/1998  Knapp et al. ................. 428/334
6,440,569 B1 *  8/2002  Kanamori et al. ............ 428/429

FOREIGN PATENT DOCUMENTS

| DE | 40 39 352 A1 | 6/1992 |
|----|--------------|--------|
| DE | 44 38 359 A1 | 5/1996 |
| DE | 195 23 442 A1 | 1/1997 |
| DE | 198 08 180 A1 | 9/1999 |
| DE | 199 01 834 A1 | 7/2000 |
| DE | 101 39 305 A1 | 3/2003 |
| WO | WO-03/102056 | 12/2003 |
| WO | WO 2004/069904 | 8/2004 |

OTHER PUBLICATIONS

International Search Report dated Aug. 30, 2005 issued in PCT/EP2005/006440.
German Patent Office Action, dated Nov. 17, 2004, issued for corresponding German Application No. 10 2004 032 013.6 (and partial English translation).
Klaus W. Mertz, Hermann A. Jehn, "Praxishandbuch Moderne Beschichtungen" (Operating Manual for Modern Coatings), Carl Hanser 2001, Chapters 1.2, 1.3, Tribological Layers.
Markus Riester, "Berichte Aus Der Chemie, Titannitrid Auf Thermoplasten" (Reports from the Field of Chemistry, Titanium Nitride on Thermoplastic Materials), Publishing House Shaker, 1998, p. 17, overview of samples, p. 64, crack formation.

* cited by examiner

*Primary Examiner*—Gwendolyn Blackwell
(74) *Attorney, Agent, or Firm*—Venable LLP; Robert Kinberg; Ryan M. Flandro

(57) ABSTRACT

The invention relates to a multilayer structure which is especially suitable for the anti-scratch sealing and decorative metallic finishing of topographically defined polymer surfaces, and to vacuum methods for building up the series of layers.

26 Claims, No Drawings

MULTILAYER STRUCTURE FOR POLYMERS

CROSS-REFERENCE TO RELATED APPLICATIONS

This application is a National Stage entry of International Application No. PCT/EP05/06440, filed Jun. 16, 2005, which claims the priority benefit of German patent application no. 10 2004 032 013.6, filed Jul. 2, 2004.

BACKGROUND

1. Field of Invention

The invention relates to a multilayer structure, which is particularly suitable for the anti-scratch sealing and decorative metal finishing of topographically defined polymer surfaces, as well as to the vacuum-technical methods for building up the layer series.

2. Related Art

As a result of the constantly increasing requirements with respect to aesthetic (luster, color) as well as functional (scratch-resistance, impact-resistance) appearance of surfaces on molded parts, particularly also in the area of molded plastic parts, attempts have long been made to improve the known and in part deficient coatings for plastic materials. As indicated in the above, these coatings have to meet several functions, must simultaneously adhere well to the molded part provided with the coating, and must be extremely resistant.

The coating methods and coatings known from prior art, for example, comprise wet-chemical processes such as the electroplating, but also vacuum methods such as the PVD (physical vapor deposition) technique. Methods of this type are also used for coating molded parts.

Reference DE 195 23 442 A1 thus discloses methods for coating articles made of metals or metal alloys, wherein one coating is deposited with the aid of the CVD (chemical vapor deposition) technique. In the process, a quartz-type coating is deposited on the molded part to generate a protective layer by converting a reactive gas mixture, comprising oxygen and an organic silicon-containing compound, with the aid of an electric gas discharge reaction to a quartz-type coating.

Reference DE 199 01 834 A1 discloses a multi-stage coating method for depositing various layers onto plastic substrates. In the process, layers such as sub-layers, barrier layers, anti-scratch layers, and sliding layers are generated through a conversion of oxygen with silicon-organic compounds. The methods described for this process are vacuum methods, involving the generating of plasma.

The disadvantages of the known methods and the advantages of the method and/or the coating according to the invention are briefly summarized in the following.

1. Coating Method Involving Electroplating

Owing to the very different processing techniques (vacuum coating technique as compared to the wet-electrolytic coating technique), the differences between the method described within the framework of this application and the electroplating method are serious and, as a rule, prove to be advantageous. Examples to be mentioned here are the noticeably reduced danger to the environment, the higher flexibility of the deposited metals, and the less problematic masking and structuring.

2. Vacuum Coating Methods

With the aid of modern vacuum-coating methods (for example PVD and CVD techniques), a plurality of layers and layer systems can be generated, which can raise the quality of the surface finish of the coated body. The use can result from an interest in reducing wear and friction, or the desire for raising the decorative appearance of the surfaces, or a combination of both. However, since the invention according to this application is not limited to silicon-containing layers, the present invention permits a broader range of material combinations and layer combinations.

A review of the relevant professional literature shows that hard, wear-resistant layers and/or layer systems (these are hard material coatings, for the most part involving nitrides, carbides, carbo-nitrides, oxides of metals or metal alloys) are primarily used in the field of tool technology and machine technology—meaning they are used on metal substrates.

With respect to this, see: Klaus W. Mertz, Hermann A. Jehn, "PRAXISHANDBUCH MODERNE BESCHICH-TUNGEN" (Operating Manual for Modern Coatings), Carl Hanser 2001, Chapters 1.2, 1.3, Tribological Layers.

We also point to the same source with respect to using vacuum-coating methods for plastic parts, primarily with respect to generating layers with optical, decorative and electrical functions. Prior art already discloses process patents for forming SiOx compounds, used for generating anti-scratch sealing coats on transparent polymer materials.

Combining hard material layers in a composite structure with polymer materials so far is viewed as basically very problematic because of the expected contrast in the profile of characteristics (hardness, plasticity, thermal coefficient of expansion).

The text by Markus Riester, "BERICHTE AUS DER CHEMIE, TITANNITRID AUF THERMOPLASTEN" (Reports from the Field of Chemistry, Titanium Nitride On Thermoplastic Materials), Publishing House Shaker, 1998, page 17, overview of samples, page 64, crack formation, teaches that when hard material layers are deposited (here: TiN or Ti/TiN—multilayer systems (2 to 6 double layers)) on extremely smooth polymer surfaces, the layer structure has a high tendency to form cracks during the build-up of the layers, starting with a layer thickness level of 0.06 μm.

Problem Definition

The problem definition follows from the aforementioned prior art and involves providing a layer structure which allows achieving the following layer characteristics:

metallic appearance crack-free surface high hardness along the edges, abrasion-resistance and scratch resistance impact-resistant surface high adherence between the layer and the substrate layer build-up without influencing the surface topography chemical resistance, in particular corrosion-resistance.

A coating technique should furthermore be made available, which ensures the production of the desired layer structure and which is distinguished by:

an environment-friendly processing technique economic production through integration of all processing steps in one and the same processing environment.

SUMMARY

The present invention provides a layer structure, a method for producing the layer structure, as well as a plastic molded part comprising the layer structure according to embodiments of the invention.

DETAILED DESCRIPTION OF THE INVENTION

The invention is based on the finding that it is essential to take into consideration the following factors for solving this object:
- a secure adherence of the layer and/or the layer system to the polymer substrate;
- compatibility of the individual main layers relative to each other, in particular with respect to thermal coefficient of expansion, adherence, hardness, and flexibility;
- the insertion of intermediate layers, if applicable, for bridging an excessive gap in the characteristics of the main layers, so that the layer composite itself and its adherence on the polymer substrate does not fail, not even when subjected to thermal or mechanical stress.

The layer structure according to the invention comprises the following main layers (starting with the plastic substrate):

I backing layer, on the basis of SiOx

II hard material multilayer composite, on the basis of a multilayer coating

III color-providing metal or metal composite layer.

Optional intermediate layers are additionally provided in some cases in dependence on the polymer substrate, the desired characteristics of the composite layer, and the resulting characteristics of the respective main layers.

According to the invention, the optional insertion of additional layers in the form of intermediate layers and/or functionalizing layers can result in the layer structure as listed in the following:

|     | layer zone | thickness range |
| --- | --- | --- |
| 0   | polymer substrate | optional |
| 1a  | intermediate layer on a functional polymer layer as basis (optional) | max. 1000 nm |
| I   | backing layer on a SiOx basis | max. 10000 nm |
| IIa | intermediate layer on the basis of a metal, metal alloy polymerization layer (optional) | max. 1000 nm |
| II  | hard material multilayer composite taking a multilayer coating as basis | max. 2000 nm |
| IIIa | intermediate layer on a metal, metal alloy polymerization layer basis (optional) | max. 1000 nm |
| III | color-providing cover layer on a metal or metal compound basis | max. 1000 nm |
| IIIb | functionalizing layer (optional) | max. 5000 nm |

As a result of the inventive combination of main layers I to III and the optional insertion of additional layers Ia, IIa, IIIa and the functionalizing layer IIIb, the present invention represents a system for generating and depositing coatings on polymer substrates, which can be used universally and which allows the desired layer combination to be deposited on a plurality of different substrates. By inserting the additional, optional intermediate layers, it is also possible to generate layer combinations which so far did not seem possible because of the differences in the material properties (for example different coefficients of expansion, resulting in the danger of cracking). Owing to the fact that the present invention has identified the critical factors influencing the problems in prior art (adherence, hardness, flexibility, thermal coefficient of expansion), the coating system according to the present invention can optionally make available numerous material and layer combinations since problematic material properties, if necessary, can be compensated for by inserting the optional intermediate layers. In the process, optional intermediate layers are always inserted if the values for selected material and layer properties of two adjacent main layers (adhesive power, hardness, flexibility, thermal coefficient of expansion) diverge too dramatically. By inserting the optional intermediate layers, the invention makes possible the compensation and/or gradual adaptation of these properties, so that a layer series can be deposited without problems.

0: Polymer Substrate

No limitations exist with respect to material selection, layer thickness, and shape for the polymer substrate to be used with the invention. According to the invention, all plastic materials can be used, in particular plastic materials that are widely used for technical applications, such as polycarbonate, polyamide, polyolefin, polyester, or the like, especially polycarbonates.

No limitations furthermore exist with respect to the thickness and form of the polymer substrates, even though thicknesses of more than a few millimeters are favored for thermal reasons. The polymer substrates can advantageously be produced with an injection-molding technique, but other techniques such as extrusion, cold-forming and hot-forming, deep-drawing and combinations thereof can also be used. The polymer substrate can comprise only a single layer or several layers, wherein material combinations can also be used. The polymer substrate can furthermore comprise auxiliary materials such as fillers or reinforcing materials such as glass fibers.

Also not limited is the surface design of the polymer substrate. Smooth surfaces as well as rough surfaces can be used along with surfaces having a specific shape, for example depressions, raised areas, and the like. The method according to the invention allows for a secure and lasting deposit of the desired layers even on those surfaces, so that the desired protective effect and/or the decorative effect is achieved without losing the surface structure.

1a: Intermediate Layer

The optional intermediate layer zone is designed to improve the adherence between the polymer substrate and the silicon-oxide backing layer I. The intermediate layer can be the boundary surface for the polymer substrate, which has been modified by a deposit of functional groups (e.g. hydroxyl, carboxyl, and/or amino groups). A typical process to be mentioned in this connection, for example, is the surface activation through an oxygen plasma treatment. The polymerizate of monomers, which in turn carry functional groups, can furthermore function as intermediate layer, wherein the example to be mentioned here is the plasma polymerization of functional monomers such as allyl alcohol, acrylic acid, or allyl amine. A plasma coating with hexamethyldisiloxane (HMDSO) with low oxygen binding and high organic component (SiOx layer with x<1.6 and preferably x<1.5) can result in an improvement of the adherence.

Methods to be used in this connection, as well as the respective process control, can be specified by one skilled in the art on the basis of information obtained from the following examples, or it can be determined with the aid of orienting experiments. Particularly suitable is an intermediate layer obtained by means of low-pressure plasma polymerization of HMDSO.

The thickness of this intermediate layer Ia generally ranges from 0.1 to 1000 nm, wherein thicknesses in the range of up to 100 nm are preferred.

This optional intermediate layer is used in cases where the adherence between backing layer and polymer substrate is too low.

I: Backing Layer

The backing layer I in particular functions to provide a functionalized surface, so that the following hard material layer can be deposited securely on the polymer substrate. A backing layer having a thickness of 100 to 10000 nm is preferred, wherein thicknesses of up to 6000 nm are sufficient in most cases. This layer preferably comprises a $SiO_x$ system as constituent component, wherein x preferably ranges from 1.4 to 2. In addition, the backing layer can also comprise additional, inorganic or organic constituents, as long as the function and the layer integrity are not negatively affected by this.

Structure

In addition to organic components, this layer is primarily composed of silicon and oxygen (SiOx), wherein the ratio is typically 1.4 to 2 oxygen atoms to one silicon atom ($SiO_{1.4}$ to $SiO_2$). The share of oxygen in the layer can be increased by feeding in additional oxygen gas ($O_2$) during the production, until a quartz-type layer with x approaching 2 is formed.

According to the invention, the backing layer preferably has a gradient or multilayer structure. At the beginning, the layer should have a low oxygen share (x~1.4) on the substrate side in order to achieve the best possible adherence.

The oxygen share must then be increased (preferably until x approaches 2) in order to increase the layer hardness and adapt the properties to those of the hard material layer II, so as to ensure good adherence in this case as well. For many embodiments, the variable x ranges from 1.4 to 2, wherein a variable range from 1.7 to 1.9 and/or 1.75 to 1.85 is sufficient to meet the desired function. This layer is preferably characterized in that the variable x either changes continuously (gradient structure) or in steps (multilayer structure), wherein the above cited rule is maintained (x is smaller on the substrate side than on the outside). This can be achieved through a suitable process control, particularly through a continuous or gradual change in the oxygen content of the reaction gas. The individual layer thickness of a multilayer structure is not limited here, as long as the desired total thickness is reached. However, the individual layers of a multilayer structure typically resemble each other closely. Particularly suitable are layers obtained with the aid of low-pressure plasma polymerization of HMDSO, with varying percentages of oxygen, for example up to a mixing ratio of 60 volume percentages HMDSO and 40 volume percentages $O_2$.

Production

The backing layer is preferably produced with the aid of a process using the plasma-supported chemical gas-phase deposition (PECVD, plasma enhanced chemical vapor deposition). The monomer gas molecules are fragmented under the influence of the plasma and are subsequently polymerized onto the substrates inserted into the plasma chamber.

Under vacuum conditions (process pressure ranging from 0.001 mbar to 100 mbar, preferably from 0.01 to 10 mbar), a silicon-containing monomer gas (e.g. hexamethyldisiloxane (HMDSO), hexamethyldisilazane (HMDSN), tetraethylorthosicilicate (TEOS)) is converted to the plasma phase through introducing electrical energy (e.g. in the form of radio frequency radiation or microwave radiation), so that a mixture of monomers, monomer fragments, molecules, atoms, ions, and electrons is present.

The electrical energy supplied to the plasma gas in this case is typically in the range of a few hundred to several thousand watts.

The plasma ignition, the plasma homogeneity, and the plasma stability can be supported by feeding in easily ionized gases (for example argon, xenon). The chemical composition of the layer can furthermore be controlled by feeding in additional oxygen, such that in particular also the desired gradient for the variable x can be reached.

IIa: Intermediate Layer

Analog to the layer Ia, the optional intermediate layer IIa takes over the adhesion-promoting function for building up the successive layers. The intermediate layer Ia can be a metal layer, for example consisting of aluminum (Al), or copper (Cu), or cobalt (Co), or iron (Fe), or nickel (Ni), or titanium (Ti), or hafnium (Hf), or vanadium (V), or niobium (Nb), or tantalum (Ta), or chromium (Cr), or molybdenum (Mo), or tungsten (W), or zirconium (Zr), or lanthanum (La), or thorium (Th), or a mixture of the aforementioned metals or it can consist of a metal compound layer, for example titanium dioxide ($TiO_2$), titanium carbide (TiC), titanium nitride (TiN), titanium oxinitride (TiON), titanium carbonitride (TiCN), or a reaction product of plasma polymerization processes, for example as diamond-like carbon layers (DLC layers); see also the explanations under Ia. The thickness typically ranges from 0 to 100 nm, wherein thicknesses of up to 50 nm are frequently sufficient.

Structure

The maximum required layer thickness for building up an intermediate layer IIa is 1000 nm. The intermediate layer IIa preferably is a metal layer composed of Al, Cu, Co, Fe, Ni, Ti, Hf, V, Nb, Ta, Cr, Mo, W, or a mixture thereof, or is a layer based on titanium ($TiO_2$, TIC, TiN, TiON, TiCN). Particularly suitable is a metal layer, preferably a titanium layer, which is produced with the stuttering technique, for example by means of DC magnetron sputtering.

Production

The layer-forming technology used for producing effective adhesion-promoting layers orients itself on the process-technical conditions provided for building up the basic layer and all following layers.

Suitable are plasma techniques (see Ia above) or also metal deposition techniques such as the sputtering. We also want to refer to the following descriptions provided in I backing layer—production and II hard material layer—production. Since the materials of the surrounding (adjacent) layers are critical for the selection of the thickness and the material for the intermediate layer IIa, it is not possible to provide a precise rule herein for the selection of the materials and the production methods.

II: Hard Material Multilayer Composite

The hard material layer II in particular functions as protective layer to prevent mechanical wear, especially in the form of an anti-scratch layer, as well as to fixate a color characteristic for the surface. The thickness of this layer typically ranges from 20 to 2000 nm, wherein frequently thicknesses of up to 600 nm or 700 nm are sufficient.

Structure

The hard material layer represents a combination of a plurality of individual layers (multilayer) that are produced on the basis of a combination of:

a. a metal selected from cobalt (Co), or titanium (Ti), or hafnium (Hf), or vanadium (V), or niobium (Nb), or tantalum (Ta), or chromium (Cr), or molybdenum (Mo), or tungsten (W), or zirconium (Zr), or lanthanum (La), or thorium (Th), and/or a mixture thereof and/or an alloy of the aforementioned metals with b. a hard material compound, selected from titanium oxide ($TiO_2$), or titanium boride ($TiB_2$), or titanium carbide (TiC), or titanium nitride (TiN), or titanium carbonitride (TiCN), or zirconium boride ($ZrB_2$), or zirconium carbide (ZrC), or zirconium nitride (ZrN), or vanadium boride ($VB_2$), or vanadium carbide (VC), or vanadium nitride (VN), or niobium boride ($NbB_2$), or niobium carbide (NbC), or niobium nitride (NbN), or tantalum boride ($TaB_2$), or tantalum carbide (TaC), or chromium boride ($CrB_2$), or chromium carbide ($Cr_3C_2$), or chromium nitride (CrN), or molybdenum boride ($Mo_2B_5$) or molybdenum carbide ($Mo_2C$), or tungsten boride ($W_2B_5$), or tungsten carbide (WC), or lanthanum boride ($LaB_6$).

The composition of the individual layers differs with respect to the share of N and/or C and/or O and/or B.

It is particularly advantageous if the hard material layer is composed of titanium and/or titanium alloys and boridic, carbidic, nitridic, oxidic, and/or carbonitridic titanium compounds.

Silicides of the metals listed in paragraph a. can also be used according to the invention for building up the hard material layer and are particularly suitable for use with the sputtering process.

According to the invention, compounds listed in paragraph b. above are particularly suitable for use as hard material compounds for producing the hard material layer II.

As explained in further detail in the following, the individual layers are arranged so as to result in a minimum of internal tensions in the layer structure. In the final analysis, this can be seen macroscopically in the crack-free appearance of the produced layers and their elastic characteristics.

The following two basic architectonic principles define the structure of the hard material multilayer according to the invention and must be taken into consideration:

a) Symmetry Principle:

The structure is symmetrical, such that—starting with a central zone that is deposited in the form of a pure metal layer or metal alloy layer—boridic, nitridic, carbidic, or carbonitridic, oxidic, oxinitridic reaction compound layers of the metals or the metal alloys follow each other toward the outside as well as toward the substrate side. The respective chemical composition of the corresponding layers in the multilayer composite structure in this case is identical, meaning the layers adjacent to the center layer are the same, the respectively following layers on both sides are also the same, and so forth. This embodiment of the hard-material layer preferably comprises a central layer of metal which is thicker than the other layers of the multilayer composite structure.

The total number of layers in the multilayer composite structure can vary, wherein it is preferable to have 7 to 99 layers and especially preferred to have 11 to 49 layers. The layer thickness of the metal layer in the center here ranges from 50 to 150 nm, preferably from 70 to 100 nm, and especially preferred is approximately 90 nm. The additional layers in the multilayer composite structure are each noticeably thinner, wherein thicknesses in the range of 8 to 25 nm are preferred and especially preferred from 10 to 20 nm. In each case, the corresponding layers (symmetrical to the central layer) have similar thicknesses.

b) Gradient Principle

The gradient principle is structurally realized in such a way that the layer hardness of the layer series for the multilayer structure initially has a declining gradient and that subsequently—starting with a purely metallic intermediate zone—the hardness gradient increases once more, wherein the gradient can be generated with the aid of a corresponding reaction control.

Production

Vacuum-technical methods are primarily considered for producing the layer zone II, such as cathode and anode arc evaporation RF (radio frequency) magnetron sputtering technique unipolar and bipolar pulsed magnetron sputtering technique bipolar pulsed dual magnetron sputtering technique beam ablation method (in the form of laser-beam ablation methods and/or electron-beam ablation methods)

electron-beam evaporation.

Layers composed totally of metal are generated by using an inert process gas, for example argon and/or xenon. For generating metal composite layers (hard material compounds of a boridic, carbidic, nitridic, oxidic, and carbonitridic nature), nitride-forming and/or carbide-forming and/or oxide-forming and/or boride-forming gases are added to the process atmosphere. The processes and processing parameters to be selected in each case are based on the information provided in the following exemplary embodiment.

In particular mixtures of argon gas (or a different inert gas) and nitrogen or oxygen and a carbon source such as methane are suitable for generating a carbidic compound, wherein the share of inert gas in this case typically amounts to 85 to 99 volume percentages.

IIIa: Intermediate Layer

Analog to Ia and IIa, the intermediate layer IIIa has an adhesion-promoting function for building up the subsequent layers. The intermediate layer IIIa can be in the form of a metal layer (e.g. Cr or Ti) or a metal alloy layer (e.g. $TiO_2$, TiC, TiN, TiON, TiCN) or in the form of reaction products of plasma polymerization processes (e.g. DLC layers). In connection with the layer IIIa, we point to the explanations provided for the layers Ia and Ia, which also apply in the same way to the layer IIIa.

Structure

The maximum layer thickness necessary for generating an intermediate layer IIIa is 1000 nm. Preferably, the layer thickness ranges from 1 to 100 nm, wherein frequently also thicknesses of up to 70 or 60 nm are sufficient.

Production

The layer-forming technique used for generating effective adhesion-promoting layers orients itself on the prevailing process conditions, provided for the base layer and the following layers. For this, see the descriptions under: I backing layer—production, II hard material multilayer composite—production, and III cover layer—production. Titanium-based materials are again preferred for this, either in the form of a metallic material or in the form of $TiO_2$, TiC, TiN, TiON, or TiCN.

III: Color-Providing Cover Layer:

The color-providing cover layer in particular has a decorative effect to provide the polymer molded part (coated substrate) with a desired color or a desired color effect or luster.

However, if the hard material layer II (in particular multilayer composite systems based of TiN can already be colored in) already has the desired color hue, then this layer III can be omitted. The layer III thickness is based on the color-providing materials selected and the desired color effects. Thicknesses in the range of 10 to 1000 nm are standard, however, wherein frequently also thicknesses of 50 to 500 nm are sufficient.

Structure

The color hue on the surface of the multilayer structure, which results from the structural stages I to II, corresponds to the color of the most extreme edge layer, meaning it has a gold tone that may already be suitable for some applications.

An additional layer (color-providing cover layer) is required for adjusting additional color hues, which layer determines the decorative effect in view a specific, desired color hue. Suitable for this are all metal coatings or compound layers of metal, which can complement the layer structure with respect to hardness and/or elastic properties. In particular the standard metals and metal compounds such as Cr, Ti, TiC etc. can be used for this.

The relevant selection criteria in this case can be summarized as follows:

The color-providing cover layer must have a hardness and/or abrasion resistance that is comparable to the substructure, so as to have a durability that corresponds to that of the total structure;

The resistance to cracking of the color-providing cover layer must be comparable to that of the substructure.

Production

The layer zone III is preferably produced with the aid of vacuum methods such as:
cathode and anode arc evaporation
RF magnetron sputtering technique
unipolar and bipolar pulsed magnetron sputtering technique
bipolar pulsed dual magnetron sputtering technique
beam ablation methods (in the form of laser-beam ablation methods and/or electron beam ablation methods)
electron beam evaporation.

Purely metallic layers are produced by using an inert process gas, while metal composite layers are produced by adding nitride-forming and/or carbide-forming and/or oxide-forming and/or boride-forming gases to the process atmosphere. In this connection, we refer to the explanations provided in the above for the layer II.

IIIb: Transparent Functional Layer:

The optional transparent functional layer can be applied as the final layer. Its thickness is based on the desired function and the materials selected for it. However, it typically ranges from 50 to 500 nm. This final layer can have the additional function of providing, for example, a hydrophilic or hydrophobic design.

Structure

To fixate additional desirable functional characteristics on the surface of the layer structure (for example the effect of being resistant to fingerprints, hydrophilic or hydrophobic properties, and automatic cleaning functions), a transparent layer can optionally be deposited to improve the surface use characteristics.

Production

All coating systems that can be adapted to metal materials and metal compound materials can be considered for the layer zone IIIb, provided they do not substantially influence the color impression of the surface:

Examples for this are:
sol-gel methods
PE-CVD coatings (plasma enhanced chemical vapor deposition)
pyrolytic coatings
adhesion-effective coating systems on the basis of suspensions with fluorine-containing compounds
vacuum technically produced layers, comprising
cathode and anode arc evaporation
RF magnetron sputtering technique
unipolar and bipolar pulsed magnetron sputtering technique
bipolar pulsed dual magnetron sputtering technique
beam ablation methods (in the form of laser-beam ablation methods and/or electron beam ablation methods)
electron beam evaporation.

The above-described embodiments of the present invention clearly show that the invention provides a variably usable coating system, which makes it possible to obtain a desired functionality and aesthetic design on polymer substrates, wherein the applied coating adheres securely to the substrate and has a noticeably reduced tendency to crack. The options described for producing the individual layer among the different layers also clearly demonstrate to one skilled in the art the multitude of options for realizing the method according to the invention. The preferred embodiments described in connection with the respective layers also apply for the plastic molded part according to the invention and the inventive method for producing multilayer systems and/or the plastic molded part.

The following exemplary embodiment (Table 1) illustrates the present invention.

Exemplary Embodiment of the Invention

Multilayer structure on polycarbonate (PC) with a silver-metallic color hue, according to Table 1, wherein the composition, layer thicknesses and processing parameters are provided for producing the layers with the following structure:

0 polymer substrate 1a intermediate layer on a basis of $SiO_x$, wherein $x=1.4$-$1.6$ 1 backing layer on a basis of $SiO_x$, wherein $x=1.75$-$1.85$ IIa intermediate layer on a basis of Ti II flexible hard material layer on a basis of titanium nitride (symmetrical structure with 21 layers)

III color-providing cover layer on a basis of titanium carbide.

TABLE 1

| | | | layer thickness | production method | process gases (vol %) | pressure (μbar) | coating source | distance substrate (mm) | performance data (kW) | (V) | process time (s) |
|---|---|---|---|---|---|---|---|---|---|---|---|
| | | | | | layer-forming conditions | | | | | | |
| 0 | polymer | PC | 3 mm plate | injection molding | — | — | — | — | — | — | — |
| 1a | intermed. layer | $SiO_x$ | 0.5 μm | microwave low- | HMDSO: 100 | 100 | MW linear | 100 | 2 | — | 30 |

TABLE 1-continued

| | | layer thickness | production method | process gases (vol %) | pressure (μbar) | coating source | distance substrate (mm) | performance data (kW) | performance data (V) | process time (s) |
|---|---|---|---|---|---|---|---|---|---|---|
| 1 | backing layer | SiOx 5 μm | pressure plasma microwave low-pressure plasma | HMDSO: 60 O₂: 40 | 100 | source 2.45 GHZ MW linear source 2.45 GHz | 100 | 2 | — | 300 |
| IIa | intermediate layer | Ti 30 nm | DC magnetron sputtering | Ar: 100 | 2.5 | DC magnetron | 100 | 0.5 | 450 | 20 |
| II | hard material layer | TiN (10) 10 nm | DC magnetron sputtering | Ar: 90 N₂: 10 | 2.6 | DC magnetron | 100 | 0.5 | 474 | 15 |
| | | TiN (9) 13 nm | DC magnetron sputtering | Ar: 91 N₂: 9 | 2.5 | DC magnetron | 100 | 0.5 | 466 | 20 |
| | | TiN (8) 15 nm | DC magnetron sputtering | Ar: 92 N₂: 8 | 2.5 | DC magnetron | 100 | 0.5 | 459 | 25 |
| | | TiN (7) 19 nm | DC magnetron sputtering | Ar: 93 N₂: 7 | 2.5 | DC magnetron | 100 | 0.5 | 459 | 30 |
| | | TiN (6) 20 nm | DC magnetron sputtering | Ar: 94 N₂: 6 | 2.5 | DC magnetron | 100 | 0.5 | 460 | 30 |
| | | TiN (5) 20 nm | DC magnetron sputtering | Ar: 95 N₂: 5 | 2.4 | DC magnetron | 100 | 0.5 | 461 | 30 |
| | | TiN (4) 20 nm | DC magnetron sputtering | Ar: 96 N₂: 4 | 2.4 | DC magnetron | 100 | 0.5 | 460 | 30 |
| | | TiN (3) 19 nm | DC magnetron sputtering | Ar: 97 N₂: 3 | 2.4 | DC magnetron | 100 | 0.5 | 457 | 30 |
| | | TiN (2) 20 nm | DC magnetron sputtering | Ar: 98 N₂: 2 | 2.4 | DC magnetron | 100 | 0.5 | 450 | 30 |
| | | TiN (1) 19 nm | DC magnetron sputtering | Ar: 99 N₂: 1 | 2.4 | DC magnetron | 100 | 0.5 | 443 | 30 |
| | | Ti 90 nm | DC magnetron sputtering | Ar: 100 | 2.4 | DC magnetron | 100 | 0.5 | 432 | 60 |
| | | TiN (1) 20 nm | DC magnetron sputtering | Ar: 99 N₂: 1 | 2.4 | DC magnetron | 100 | 0.5 | 421 | 30 |
| | | TiN (2) 20 nm | DC magnetron sputtering | Ar: 98 N₂: 2 | 2.4 | DC magnetron | 100 | 0.5 | 442 | 30 |
| | | TiN (3) 19 nm | DC magnetron sputtering | Ar: 97 N₂: 3 | 2.4 | DC magnetron | 100 | 0.5 | 457 | 30 |
| | | TiN (4) 19 nm | DC magnetron sputtering | Ar: 96 N₂: 4 | 2.4 | DC magnetron | 100 | 0.5 | 463 | 30 |
| | | TiN (5) 19 nm | DC magnetron sputtering | Ar: 95 N₂: 5 | 2.4 | DC magnetron | 100 | 0.5 | 464 | 30 |
| | | TiN (6) 20 nm | DC magnetron sputtering | Ar: 94 N₂: 6 | 2.5 | DC magnetron | 100 | 0.5 | 462 | 30 |
| | | TiN (7) 20 nm | DC magnetron sputtering | Ar: 93 N₂: 7 | 2.5 | DC magnetron | 100 | 0.5 | 458 | 30 |
| | | TiN (8) 15 nm | DC magnetron sputtering | Ar: 92 N₂: 8 | 2.5 | DC magnetron | 100 | 0.5 | 456 | 25 |
| | | TiN (9) 13 nm | DC magnetron sputtering | Ar: 91 N₂: 9 | 2.5 | DC magnetron | 100 | 0.5 | 454 | 20 |
| | | TiN (10) 10 nm | DC magnetron sputtering | Ar: 90 N₂: 10 | 2.5 | DC magnetron | 100 | 0.5 | 452 | 15 |

TABLE 1-continued

|   |   |   | layer thickness | production method | process gases (vol %) | pressure (µbar) | coating source | distance substrate (mm) | performance data (kW) | performance data (V) | process time (s) |
|---|---|---|---|---|---|---|---|---|---|---|---|
| III | cover layer | TiC | 88 nm | DC magnetron sputtering | Ar: 94 CH$_4$: 6 | 2.7 | DC magnetron | 100 | 0.5 | 444 | 120 |

TiN (i) with i=1 to 10 characterizes the TiN layer with the aid of the process gas composition. For example, for i=4, the share of N$_2$ in the process gas is 4 volume percentages while the share of Ar accordingly is 96 volume percentages.

Layer Properties

Layer Analysis:

Surface-oriented analysis methods and micro-hardness measurements according to Martens are used for monitoring the layers generated during the build-up of the layer structure.

To prevent the layers underneath from influencing the analysis results, layers which are thicker by one or two orders of magnitude than the actual layers in the multilayer structure can be used for the analyses. In the case of the hard material multilayer system, built up with TiN, there is a connection between the color hue and the nitrogen content in the metal compound layer TiN, so that it is possible to visually follow the generating of the gradient structure.

As proof that the topographic features of the coated polymer surface are for the most part maintained, comparable REM [scanning electron microscope SEM] analyses are used.

Qualification Criteria:

The following criteria are used for the qualification with respect to optical, mechanical, thermal, and chemical requirements to be met by the layer system:
characterization of color via spectral analysis
thermal resistance:
resistance to temperature changes DIN 53496 A
resistance to temperature changes 110° C./1 h
resistance to thermal shock 3×100° C. H$_2$O/18° C. H$_2$O
weathering ability
sunlight simulation DIN 75220
mechanical stress
falling-ball test m=1 kg, H=500 mm, T=30° C.
scratch resistance based on Erichsensen 435, F=10 N
multiple rock impact resistance DIN 55996-1
chemical resistance DIN 53449 T3
corrosion resistance DIN 50021-CASS.

The exemplary embodiment according to the invention shows that an excellent coating can be deposited, for example on a polycarbonate substrate, with the aid of the present invention. The coating according to the invention meets the requirements for hardness, durability, flexibility, and stability.

With the method according to the invention for producing a multilayer structure, it is also possible to deposit coatings onto formed substrates of a polymer material, for example door entrance edges, emblems, decorative parts, operating elements and coverings in the automotive sector, edge bands, profiles, decorative parts and coverings in the furniture sector, in the kitchen, office, bath area, on fittings lined on the inside with polymer material, on covers, operating elements, and decorative parts for data processing equipment and in the area of consumer electronics, on the outside and inside of window profiles, on the outside surfaces and inside surfaces of hollow molded parts, produced with the extrusion method.

The invention claimed is:

1. A multilayer structure for polymer substrates, comprising
   a backing layer,
   a hard material layer, and
   a cover layer,
   wherein the backing layer comprises SiO$_x$, wherein x ranges from 1.4 to 2, and wherein the hard material layer comprises metal-containing compounds.

2. The multilayer structure according to claim 1, wherein the hard material layer is embodied as a multilayer composite structure.

3. The multilayer structure according to claim 2, wherein the multilayer composite is selected from among multilayer composite systems based on the principle of symmetry and from among multilayer composite systems based on the gradient principle.

4. The multilayer structure according to claim 3, wherein the multilayer composite system based on the symmetry principle comprises a total of 11 to 99 layers and has a metal or metal alloy layer arranged approximately in the center, wherein the metal or metal alloy is selected from among: cobalt, or titanium, or hafnium, or vanadium, or niobium, or tantalum, or chromium, or molybdenum, or tungsten, or zirconium, or lanthanum, or thorium, or a combination thereof.

5. The multilayer structure according to claim 3, wherein the multilayer composite system comprises one or several compounds, formed with the metals or metal alloys selected from the group consisting of cobalt, titanium, hafnium, vanadium, niobium, tantalum, chromium, molybdenum, tungsten, zirconium, lanthanum, thorium, and a combination thereof.

6. The multilayer structure according to claim 1, wherein the composition of the SiO$_x$ backing layer changes gradually, with increasing stoichiometric value x in the direction of the hard material layer.

7. The multilayer structure according to claim 1, further comprising an intermediate layer, arranged between a polymer substrate layer and the backing layer.

8. The multilayer structure according to claim 1, further comprising an intermediate layer between the backing layer and the hard material layer.

9. The multilayer structure according to claim 1, further comprising an intermediate layer between the hard material layer and the cover layer.

10. The multilayer structure according to claim 1, further comprising a functionalizing layer on top of the cover layer.

11. The multilayer structure according to claim 1, wherein the maximum thickness of the backing layer is 10000 nm.

12. The multilayer structure according to claim 1, wherein the maximum thickness of the hard material layer is 2000 nm.

13. The multilayer structure according to claim 1, wherein the maximum thickness of the cover layer is 1000 nm.

14. The multilayer structure according to claim 1, wherein the cover layer comprises a titanium compound.

15. The multilayer structure according to claim 8, wherein the intermediate layer is composed of aluminum (Al), or copper (Cu), or cobalt (Co), or iron (Fe), or nickel (Ni), or titanium (Ti), or hafnium (Hf), or vanadium (V), or niobium (Nb), or tantalum (Ta), or chromium (Cr), or molybdenum (Mo), or tungsten (W), or zirconium (Zr), or lanthanum (La), or thorium (Th), or a mixture thereof.

16. The multilayer structure according to claim 8, wherein the intermediate layer has a maximum thickness of 1000 nm.

17. The multilayer structure according to claim 7, wherein the intermediate layer has a maximum thickness of 1000 nm.

18. The multilayer structure according to claim 9, wherein the intermediate layer has a maximum thickness of 1000 nm.

19. The multilayer structure according to claim 10, wherein the functionalizing layer has a maximum thickness of 5000 nm.

20. A plastic molded part, comprising a polymer substrate and a multilayer structure as defined in claim 1 deposited on at least one surface of the polymer substrate.

21. The plastic molded part according to claim 20, wherein the polymer substrate comprises a material that is selected from the group consisting of polycarbonate, polyamide, polyester, and polyolefin.

22. The multilayer structure according to claim 1, wherein the composition of the $SiO_x$ backing layer changes continuously, with increasing stoichiometric value x in the direction of the hard material layer.

23. The multilayer structure according to claim 1, wherein the composition of the $SiO_x$ backing layer changes discontinuously, with increasing stoichiometric value x in the direction of the hard material layer.

24. The multilayer structure according to claim 14, wherein the titanium compound is selected from the group consisting of $TiO_2$, TiC, TiN, TiON, TiCN, and a combination thereof.

25. The multilayer structure according to claim 8, wherein the intermediate layer is composed of a metal composite layer of $TiO_2$, or TiC, or TiN, or TiON, or TiCN.

26. The multilayer structure according to claim 8, wherein the intermediate layer is composed of a reaction product of a plasma polymerization process comprising a diamond-like carbon layer (DLC layer).

* * * * *